United States Patent [19]
Yoshioka

[11] Patent Number: 5,357,136
[45] Date of Patent: Oct. 18, 1994

[54] SEMICONDUCTOR DEVICE WITH ANCHORED INTERCONNECTION LAYER

[75] Inventor: Kentaro Yoshioka, Ohiramura, Japan

[73] Assignee: Oki Electric Industry Co., Ltd., Tokyo, Japan

[21] Appl. No.: 42,401

[22] Filed: Apr. 2, 1993

[30] Foreign Application Priority Data

Apr. 10, 1992 [JP] Japan .................................. 4-090719

[51] Int. Cl.$^5$ ..................... H01L 27/02; H01L 23/48; H01L 29/46
[52] U.S. Cl. .................... 257/383; 257/384; 257/385; 257/739; 257/751; 257/755; 257/757; 257/764
[58] Field of Search ............... 257/302, 383, 384, 385, 257/739, 751, 755, 757, 764

[56] References Cited

U.S. PATENT DOCUMENTS

| | | | |
|---|---|---|---|
| 4,392,150 | 7/1983 | Courreges | 257/383 |
| 4,604,641 | 8/1986 | Konishi | 257/383 |
| 4,975,756 | 12/1990 | Haken et al. | 257/383 |
| 5,121,186 | 6/1992 | Wong et al. | 257/384 |

FOREIGN PATENT DOCUMENTS 2-36539  2/1990  Japan .................................. 257/384

*Primary Examiner*—Ngan Van Ngo
*Attorney, Agent, or Firm*—Steven M. Rabin

[57] ABSTRACT

A semiconductor device having a bonding pad region, and a method of its fabrication. A conductive layer is formed on an isolation layer separating transistors of the device, to anchor the interconnection layer on the bonding region. The conductive layer may be formed from the same layer of material that gate electrodes of the transistors are formed. An oxide insulation layer covers the conductive layer and has at least one opening exposing the conductive layer in the bonding pad region. A barrier metal layer, formed on the diffusion regions and the insulation layer, extends into the opening where it makes a firm direct connection with the exposed conductive layer. A bonding pad is formed on the barrier metal layer by providing the interconnection layer on the barrier metal layer. Since the conductive layer and the barrier metal layer are firmly connected, and secures the interconnection layer in the bonding pad structure. According to a method of fabrication, the conductive layer is formed on the isolation layer simultaneously with the formation of the gate electrode, and then covered by the insulation layer. The openings are then provided in the insulation layer to expose the conductive layer. The barrier metal layer is then formed on the insulation layer so that it contacts the diffusion region and extends into the opening to become fixed to the conductive layer. The interconnection layer is then formed on the conductive layer.

19 Claims, 4 Drawing Sheets

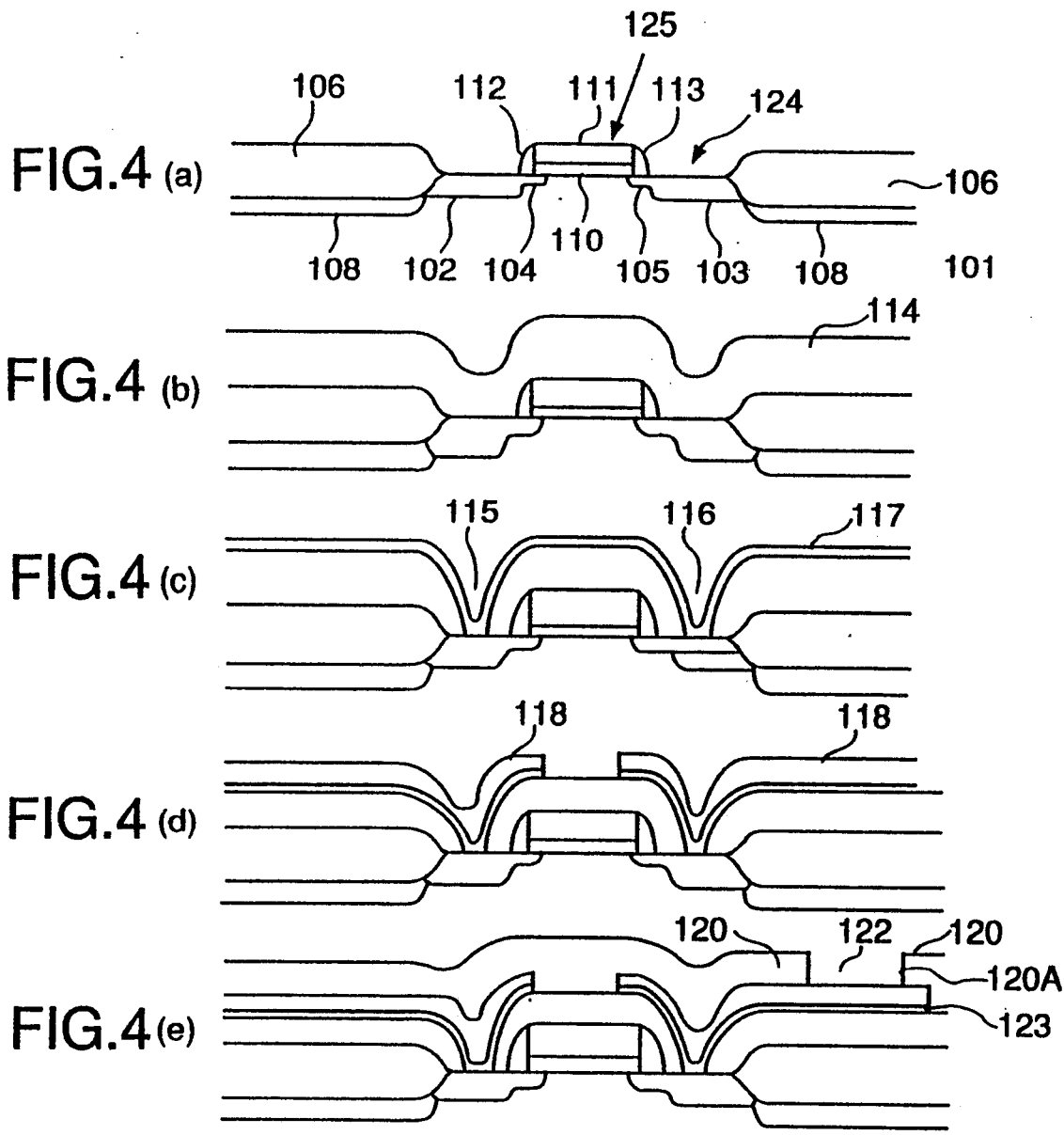
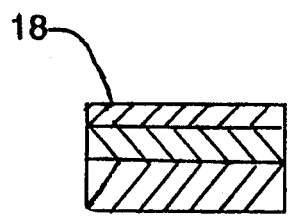
FIG. 5

SEMICONDUCTOR DEVICE WITH ANCHORED INTERCONNECTION LAYER

CROSS-REFERENCE TO RELATED APPLICATIONS

This application claims the priority benefits of Japanese application No. 4-090719, filed Apr. 10th, 1992 the entire disclosure of which is incorporated herein by reference.

BACKGROUND OF THE INVENTION

1. Field of the Invention

This invention relates to a semiconductor device and, more particularly, to a MOS (Metal-Oxide-Silicon) integrated circuit device having an improved bonding pad structure.

2. Description of Related Art

The use of barrier metal technology is inevitable for 0.5 micron designs of semiconductor devices. In a process of fabricating a semiconductor device containing MOS transistors, to which the barrier metal technology is applied, a thick field oxide layer is formed on the substrate to isolate the active regions from each other. The gate electrode of the MOS transistors are generally formed by polysilicon, refractory metal or the like. Typically, an oxide insulation layer, containing phosphorus or boron, is applied to the whole surface of the substrate using a CVD (Chemical Vapor Deposition) method. Openings are formed in the oxide insulation layer to expose the diffusion regions of the transistors.

A barrier metal layer then is deposited over the entire oxide insulation layer, and the exposed diffusion regions. The barrier metal layer serves to prevent solid phase epitaxy in the openings of the integrated circuit device employing a conductive pattern, 0.5 micron in width. Materials for the barrier metal layer generally include a refractory material such as $MoSi_x$ (molybdenum silicide), $WSi_x$ (tungsten silicide), or the like, and TiN (titanium nitride). The refractory materials are deposited by a sputtering method, and the TiN is deposited by nitriding titanium or by a reactive sputtering method.

After the barrier metal layer is formed, an aluminum alloy layer is deposited on its entire surface. Known photolithography and etching techniques are applied to the aluminum layer to form fine interconnection layers that extend between the diffusion regions of the different transistors, and to bonding pad regions on the isolation layer. An exterior insulating layer for protecting the integrated circuit from the outside atmosphere and mechanical damage, is then applied. Openings are provided in the protection layer at the bonding pad regions to expose the interconnection layer so that leads may be affixed.

SUMMARY OF THE INVENTION

It is therefore a first object of the invention to provide a semiconductor device with a bonding pad structure in which a barrier metal layer and an interconnection layer are more firmly connected to each other in order to increase their yield rate.

It is second object of the invention to provide a process for fabricating a semiconductor device having such a bonding pad structure, which process does not require an increased number of steps.

The forgoing first object is accomplished in a semiconductor device including a semiconductor substrate on which a transistor and an isolation layer are formed. A conductive layer formed of a gate material is provided on the isolation layer to spaced relation to the transistor's gate electrode. An insulation layer covers the conductive layer and has at least one opening exposing the conductive layer in a bonding pad region of the device. A barrier metal layer, formed on the diffusion regions and the insulation layer, extends into the opening where it makes a firm direct connection with the exposed conductive layer. A bonding pad is formed on the barrier metal layer by providing on the barrier metal layer an interconnection layer that is exposed in the bonding pad region. Since the conductive layer and the barrier metal layer are firmly connected, the conductive layer anchors the barrier metal layer in place, and secures the interconnection layer of the bonding pad structure.

The forgoing second object is accomplished by a method of fabricating a semiconductor device having an isolation layer for isolating active regions. A conductive layer is formed on the isolation layer and then covered by an insulation layer. At least one opening is provided in the insulation layer to expose the conductive layer. A barrier metal layer is then formed on the insulation layer such that it contacts a diffusion region and extends into the opening to become fixed to the conductive layer. An interconnection layer for a bonding pad is then formed on the conductive layer.

BRIEF DESCRIPTION OF THE DRAWINGS

The above and other objects and features of the invention will be apparent to those skilled in the art from the following description of preferred embodiments of the invention, when considered with the accompanied drawings in which:

FIGS. 4(a) to 4(e) are cross sections showing different stages of fabricating a conventional semiconductor device not according to the invention; and FIG. 5 is a cross section of the barrier metal layer, showing the multiple layers thereof.

DETAILED DESCRIPTION OF THE PREFERRED EMBODIMENTS

Figure 1:
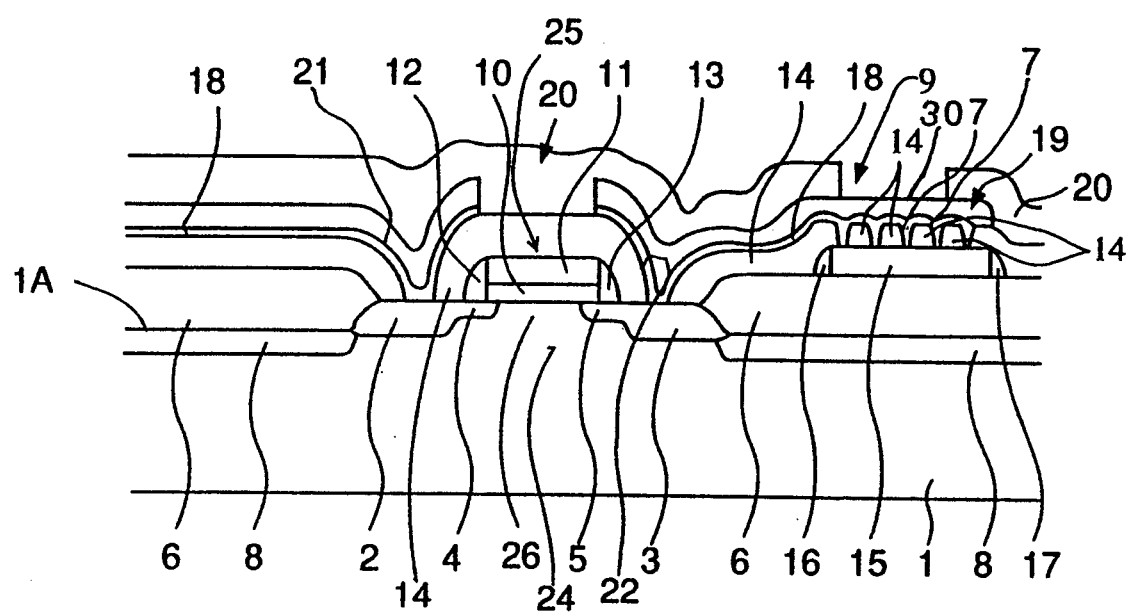
FIG. 1 is a cross-sectional view of a semiconductor device according to a preferred embodiment of the invention.

The invention may be best understood in comparison to another method of fabrication, such as is illustrated in FIGS. 4(a) to 4(e).

The method of FIGS. 4(a) to 4(e), using barrier metal technology, has been applied to the fabrication of a semiconductor device containing active regions, including MOS transistors having lightly doped drain (LDD) structures. One MOS transistor 125 of an active region 124 on a silicon wafer substrate 101, is illustrated in FIG. 4(a). Diffusion regions 102, 103, which define a channel regions therebetween, are doped in a conductivity type opposite to that of the substrate 101 and employ lightly doped regions 104, 105 for increasing the durability of the transistor 125 by reducing the occurrence of hot carriers. A thick field oxide layer 106 is formed on the substrate 101 to isolate the active regions from each other. A heavily doped channel stopper layer 108, having the same conductivity as that of the substrate, is formed under the field oxide layer 106 to increase the isolation among transistors. The MOS transistor 125 also includes a gate oxide layer 110 over the channel region 126 and a gate electrode 111 over the gate oxide layer. The gate electrode is generally formed of polysilicon, refractory metal or the like. Oxide side walls 112, 113 are formed on the sides of the gate electrode 111 to form the LDD structure. (They serve as a mask at a time of ion implantation to introduce impurities into the substrate 101 during formation of diffusion regions 102, 103.)

Referring to FIG. 4(b), an insulation layer 114 next is applied to the whole upper surface of the device. The insulation layer is typically formed by an oxide containing phosphorus or boron, and is applied using a CVD (Chemical Vapor Deposition) method. Openings 116 are formed in the insulation layer 114 to expose the diffusion regions 102, 103.

As shown in FIG. 4(c), a barrier metal layer 117 is deposited over the entire insulation layer, including the openings 116. After the barrier metal layer is formed, an aluminum alloy layer is deposited on its entire surface and plugs the openings 116 as shown in FIG. 4(d). An exterior insulating layer 120 is then applied, as shown in FIG. 4(e). Openings 120A in the layer 120 are provided in a bonding pad region 122 to expose the interconnection layer for connection of wire leads.

FIG. 1 shows a semiconductor device, having an improved bonding pad structure according to a preferred embodiment of the invention. The semiconductor device includes a semiconductor wafer substrate 1 consisting of, for example, a silicon wafer. Circuit elements, such as the MOS transistor 25, are provided in and on active regions of the substrate, such as the active region 24. A field oxide isolation layer 6 is formed on the major surface 1A of the substrate 1 to isolate the active regions from each other. A channel stop 8 is formed beneath the isolation layer 6 to enhance the isolation among active regions.

Diffusion regions 2, 3, which serve respectively, as the source and the drain of the MOS transistor 25, are formed in the active region 24 and are surrounded and divided by the isolation layer 6. The transistor 25 has an LDD structure. Therefore, the inner sides of the diffusion regions 2, 3 have lightly doped regions 4, 5.

A gate electrode 11 is formed on a gate oxide layer 10 above the channel region 26. Side wall oxides 12, 13 are formed on both sides of the gate electrode 11. A conductive layer 15, formed from the same material as that of the gate electrode 11, is provided on the isolation layer 6 in a region 9 for a bonding pad. Oxide side walls 16, 17 are formed on opposite sides of the conductive layer 15.

An interlayer insulator (insulation layer) 14 is formed on the gate electrode 11, the isolation layer 6 and the conductive anchor layer 15. A CVD (Chemical Vapor Deposition) oxide containing phosphorus or boron may be used for the layer 14. The insulation layer 14 has at least one opening 7 that exposes portions of the upper surface of the conductive layer 15. Preferably, a plurality of such openings 7 are provided. The insulation layer 14 also has openings 21, 22 that expose portions of the upper surface or the respective diffusion regions 2, 3.

A barrier metal layer 18 consisting of refractory materials known to those skilled in the art, is formed on the interlayer insulator 14. Referring to FIG. 5, the layer 18 may, for example, consist multiple layers, for example, layers of TiN (titanium nitride), TiW (titanium tungsten), and W (tungsten). Alternatively, a layer of TiN, and silicide layers containing molybdenum or tungsten may be used for the barrier metal layer. These materials bond well with those of the conductive layer 15. The barrier metal layer typically should have a thickness in a range from 500 to 1000 Å. The barrier metal layer 18 fills the openings 7 and makes direct bonding contact with the exposed portions of the conductive layer 15. The barrier metal layer 18 also makes direct physical and electrical contact with an upper side of the diffusion regions 2, 3, through the insulation layer openings 21,22.

An interconnection layer 19, formed of an aluminum alloy, is provided onto the barrier metal layer 18. The interconnection layer 19 extends over the bonding pad region 9 and the diffusion regions 2, 3 and defines a binding pad 30 over the openings 7 and the conductive layer 15. A protective insulation layer 20 covers the interconnection layer 19. A pad opening 23 is provided in the insulation layer 20 to expose the interconnection layer 19 in the bonding pad region 9.

Thus, the barrier metal layer 18 is fixed through openings in the insulation insulator 14, to a conductive layer 15, and the interconnection layer is formed on the barrier metal layer. Accordingly, the barrier metal layer and the interconnection layer are firmly secured or anchored onto the region of the bonding pad.

A process for fabricating the above semiconductor device is now described with reference to FIGS. 2(a) –2(e).

Figure 2:
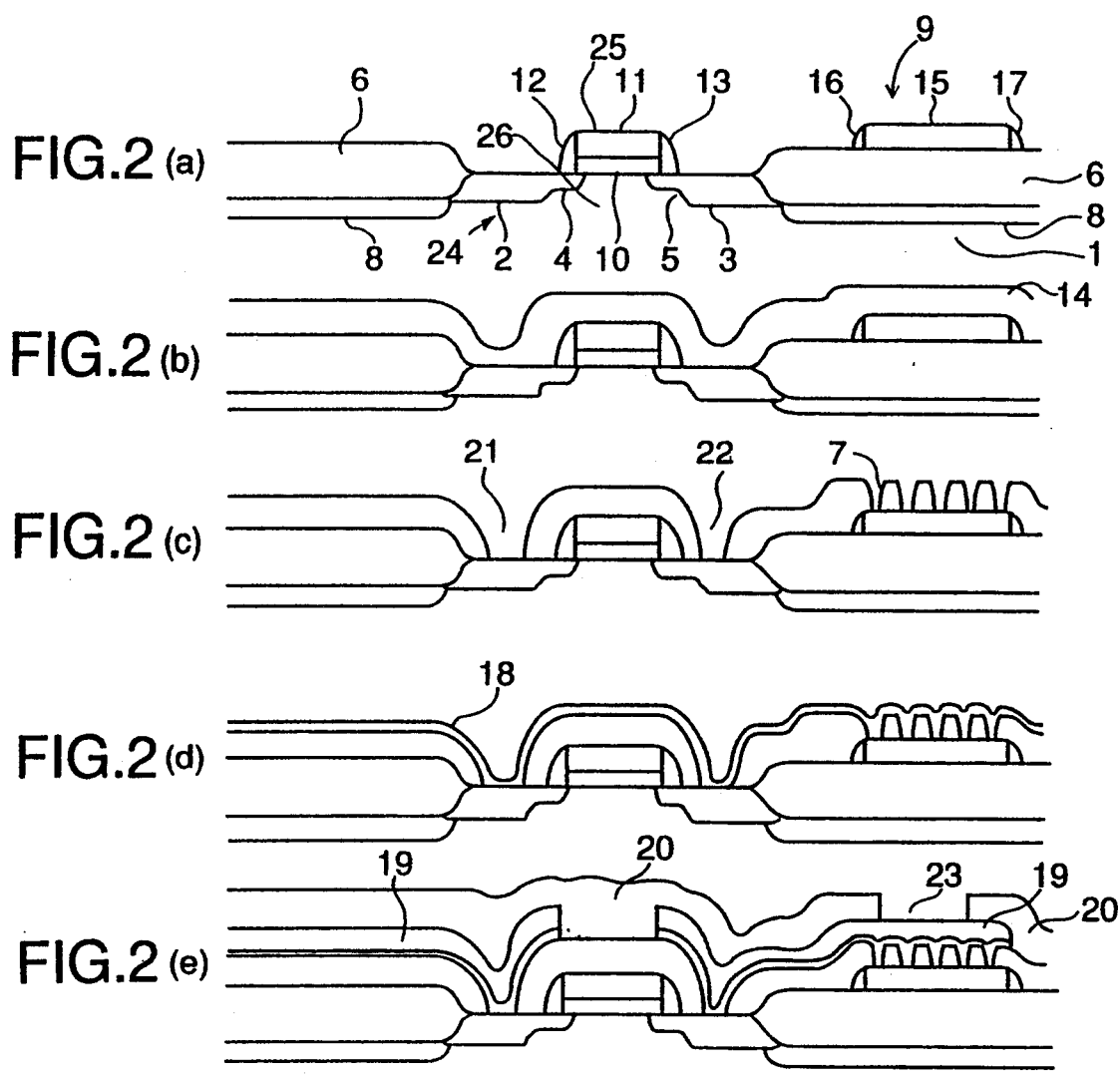
FIGS. 2(a) to 2(e) are cross sections showing different stages of a preferred method of fabricating the semiconductor device shown in FIG. 1.

FIG. 2(a) shows a cross section of a stage of fabrication of the semiconductor device according to the preferred embodiment of the invention. More specifically, at this stage, the diffusion regions 2, 3, are doped by ion implantation to have a conductivity type opposite to that of the substrate 1, and to retain lightly doped regions 4, 5, which form a part of the LDD structure. To isolate the active regions from each other, the thick, field oxide, isolation layer 6 is formed on the substrate 1, as by a selective oxidation process well known to those skilled in the semiconductor art.

The gate electrode 11, over the thin gate oxide 10, comprises a layer of polysilicon, silicide, refractory metal, polycide, or the like. When the gate electrode is formed, the conductive layer 15 is simultaneously formed using the same gate material. The oxide side walls 12, 13 and 16, 17 are formed on the opposite sides, respectively, of the gate electrode 11 and the conductive layer 15. The side walls 12, 13 serve to mask the lightly doped regions 4, 5 during the high density doping of the diffusion regions 2, 3.

As shown in FIG. 2(b), after the doping of the diffusion regions 2, 3, the oxide interlayer insulator (insulation layer) 14, which may contain phosphorus or boron as an impurity, is deposited over the entire surface of the substrate 1, using a CVD process. As a result, the gate electrode 11 and the conductive layer 15 are covered with the insulation insulator 14.

As shown in FIG. 2(c), openings 21, 22 for exposing the surface of the diffusion regions 2, 3, and openings 7 for exposing the surface of the conductive layer 15, are then formed in the layer 14. Next, as shown in FIG. 2(d), the barrier metal layer 18 is formed over the surface of the insulation layer 14 and within the openings 7, 21 and 23. The layer 18 may be formed by conventional methods, for example, by CVD or sputtering deposition of silicide layers containing molybdenum or tungsten, and by nitriding or reaction sputtering a layer of titanium nitride onto the layer 14. The barrier metal layer 18 so applied directly contacts the surface of the diffusion regions 2, 3, within the openings 21, 22, and directly contacts the surface of the conductive layer 15, within the openings 7.

To provide the interconnection layer 19, an aluminum alloy layer is deposited onto the barrier metal layer 18 and patterned in a predetermined manner using conventional photolithographic masking and etching techniques. The protection layer 20 is then formed over the entire interconnection layer 19 and interlayer insulator 14. The protection layer 20 may be formed by applying insulation material using a conventional thermal CVD deposition process. Alternatively, the protection layer may be formed by applying silicon nitride using a conventional plasma CVD process.

A pad opening 23 is then formed in the protection layer, in the bonding pad region 9, to expose the interconnection layer 19 for wire lead connection.

Figure 3:
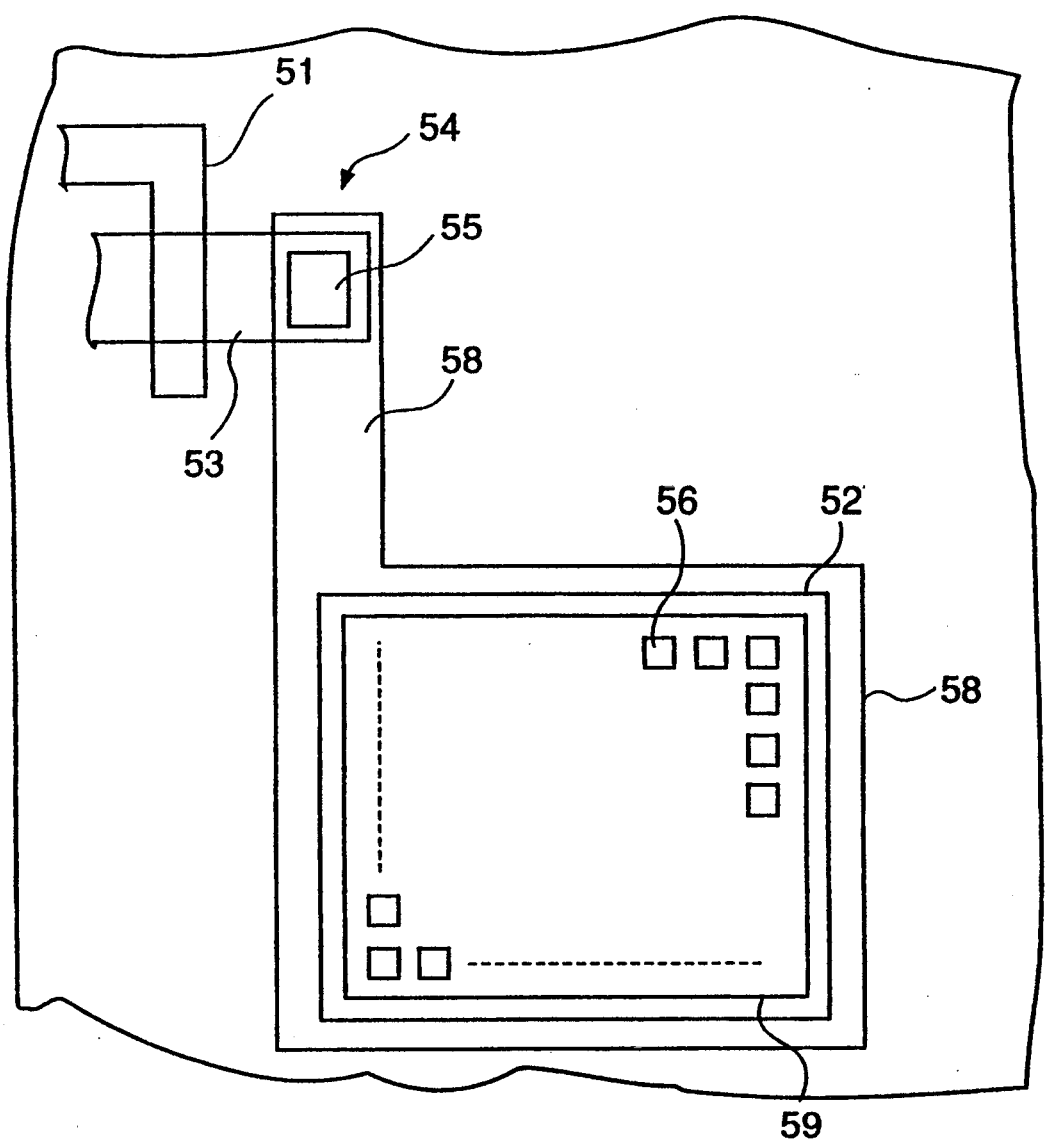
FIG. 3 is a plan view of a layout of a bonding pad structure of the semiconductor device according to the preferred embodiment.

Referring to FIG. 3, a schematic plan view of an exemplary layout of a part of a semiconductor device according to the invention is shown with some layers omitted for ease of understanding. A diffusion region 53 in an active region is enclosed by a thick, field oxide isolation layer 54. A gate electrode 51 extends from the field oxide layer 54 and across the active region. An opening 55 for plugging into the diffusion region 53 is formed through an interlayer insulator not shown. At the opening 55, an interconnection layer 58 and a barrier metal layer provided thereunder, are connected to the diffusion layer 53. The interconnection layer 58 also extends over a region of a bonding pad, at which a plurality of openings 56 is arranged in the interlayer insulator (not shown). Through the openings 56, the barrier metal layer connects the interconnection layer 58 with the surface of a conductive layer 52 formed on the isolation layer 54. Since the interconnection layer 58 directly contacts the surface of the conductive layer 52, the interconnection layer 58 is firmly secured above the isolation layer 54. In the bonding pad region, a pad opening 59 in a protection layer (not shown) exposes the surface of the interconnection layer 58 thereberneath.

It is to be noted that although a protection circuit, for protecting the integrated circuit from surge current and the like, is not illustrated, the semiconductor device according to the invention may include such a protection circuit between the diffusion regions and the bonding pads, as is known to those skilled in the art. Moreover, although the conductive layer 52 is formed at the same layer as the gate electrode 51, the conductive layer 52 can be formed in another layer. Further, the layout of the conductive layer 52, the interconnection layer 58, and the pad opening 59, shown in FIG. 3 is merely exemplary, and other useful layouts are contemplated.

It is understood that although the invention has been described in detail with respect to preferred embodiments thereof, various other embodiments and variations thereof will be apparent to those skilled in the art, without departing from the scope of the invention that is limited only by the following claims.

What is claimed is:
1. A semiconductor device, comprising:

a plurality of active regions on said semiconductor substrate, at least one of said active regions having therein and thereon a transistor, said transistor having a gate electrode;
an isolation layer formed on said major surface for isolating said active regions;
a conductive layer formed on said isolation layer;
an insulation layer covering said conductive layer and having at least one opening exposing said conductive layer;
a barrier metal layer on said insulation layer, said barrier metal layer connected to a diffusion region of said transistor, said barrier metal layer extending into said at least one opening to contact said conductive layer; and
an interconnection layer formed on said barrier metal layer and electrically connected to said diffusion layer, a portion of said interconnection layer over said at least one opening and said conductive layer, said portion of said interconnection layer forming a bonding pad, wherein said insulation layer covers a portion of said isolation layer between said diffusion region and said bonding pad, said barrier metal layer and said interconnection layer extending from said conductive layer to said diffusion region on said insulation layer.

2. A semiconductor device according to claim 1, wherein said gate electrode is formed of a gate electrode material, said conductive layer formed of the same material as said gate electrode.

3. A semiconductor device according to claim 2, wherein said insulation layer covers said transistor.

4. A semiconductor device, comprising:
a semiconductor substrate;
a transistor on said substrate, a bonding pad region being defined on said substrate at a location predetermined in relation to said transistor;
an isolation layer on said substrate;
an insulation layer on said isolation layer, said insulation layer having an opening formed therein within said bonding pad region;
a barrier metal layer on said insulation layer, said barrier metal layer extending into said opening;
an interconnection layer formed on said barrier metal layer, said interconnection layer electrically connected to said transistor and extending into said bonding pad region to form a bonding pad on said barrier metal layer over said opening; and
an anchor layer, between said insulation layer and said isolation layer, directly beneath said of opening, said barrier metal layer directly contacting and fixed to said anchor layer through said opening.

5. A semiconductor device according to claim 4, further comprising a protection layer over said barrier layer, said protection layer having a pad opening on said bonding pad which exposes said interconnection layer for wire lead connection.

6. A semiconductor device according to claim 4, wherein said transistor comprises a first conductive layer, said anchoring layer comprising a second conductive layer.

7. A semiconductor device according to claim 6, wherein said transistor is a MOS transistor, said first conductive layer comprising a gate electrode formed of the same material as forms said second conductive layer.

8. A semiconductor device according to claim 4, wherein said barrier metal layer fixes said interconnection layer to said conductive layer through said at least one opening, said conductive layer fixing said barrier metal layer to said isolation layer.

9. A semiconductor device according to claim 8, wherein said barrier metal layer comprises a silicide layer containing molybdenum or tungsten.

10. A semiconductor device according to claim 9, wherein said barrier metal layer further comprises a titanium nitride layer.

11. A semiconductor device according to claim 10, wherein said gate electrode and said conductive layer comprise materials selected from the group of materials consisting of polysilicon, silicide, refractory metal and polycide.

12. A semiconductor device according to claim 8, wherein said barrier metal layer has a thickness in a range of 500 to 1000 Å.

13. A semiconductor device according to claim 8, wherein said gate electrode and said conductive layer are both formed in a single layer between said insulation layer and said isolation layer.

14. A semiconductor device according to claim 8, wherein said isolation layer is formed of a field oxide, said conductive layer comprising materials selected from the group of materials consisting of polysilicon, silicide, refractory metal and polycide.

15. A semiconductor device according to claim 14, wherein said insulation layer comprises an oxide.

16. A semiconductor device according to claim 1, wherein said at least one opening comprises a plurality of openings, said barrier metal layer being fixed to said conductive layer through each of said plurality of openings.

17. A semiconductor device according to claim 1, wherein said insulation layer is an oxide, said barrier metal layer comprising a silicide layer containing molybdenum or tungsten and a titanium nitride layer.

18. A semiconductor device according to claim 1, wherein said insulation layer is an oxide, said barrier metal layer comprising titanium nitride, titanium tungsten, and tungsten layers.

19. A semiconductor layer according to claim 1, further comprising a protection layer over said barrier layer, said protection layer having a pad opening exposing said bonding pad for lead wire connection.

* * * * *